(12) United States Patent
Kim et al.

(10) Patent No.: US 12,707,864 B2
(45) Date of Patent: Aug. 11, 2026

(54) DISPLAY DEVICE AND METHOD OF MANUFACTURING THE SAME

(71) Applicant: Samsung Display Co., LTD., Yongin-si (KR)

(72) Inventors: Hwi Seong Kim, Yongin-si (KR); Dong Hoo Kim, Yongin-si (KR); Ji Hun Park, Yongin-si (KR); Maeng Ha Lee, Yongin-si (KR); Jae Man Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 448 days.

(21) Appl. No.: 18/472,115

(22) Filed: Sep. 21, 2023

(65) Prior Publication Data

US 2024/0315113 A1 Sep. 19, 2024

(30) Foreign Application Priority Data

Mar. 13, 2023 (KR) ........................ 10-2023-0032778

(51) Int. Cl.
*H10K 59/80* (2023.01)
*H10K 59/12* (2023.01)

(52) U.S. Cl.
CPC ....... *H10K 59/873* (2023.02); *H10K 59/1201* (2023.02)

(58) Field of Classification Search
CPC ......................... H10K 59/873; H10K 59/1201
See application file for complete search history.

(56) References Cited

U.S. PATENT DOCUMENTS 9,860,942 B2 * 1/2018 Lee ........................ H05B 33/04

FOREIGN PATENT DOCUMENTS

| | | | | |
|---|---|---|---|---|
| JP | 6696143 B2 | | 5/2020 | |
| KR | 10-0639005 B1 | | 10/2006 | |
| KR | 10-0712185 B1 | | 4/2007 | |
| KR | 10-1012785 B1 | | 2/2011 | |
| KR | 10-1084270 B1 | | 11/2011 | |
| KR | 10-2020-0104451 A | | 9/2020 | |
| WO | WO-2025025074 A1 | * | 2/2025 | ............... G09F 9/30 |

* cited by examiner

*Primary Examiner* — Joseph L Williams
(74) *Attorney, Agent, or Firm* — Womble Bond Dickinson (US) LLP

(57) ABSTRACT

A display device includes: a display panel including a semiconductor wafer substrate and an OLED on the semiconductor wafer substrate; an encapsulation substrate on the display panel; a sealing member between the display panel and the encapsulation substrate to couple the display panel with the encapsulation substrate; and a filler surrounded by the sealing member between the display panel and the encapsulation substrate, wherein the sealing member includes: an organic spacer corresponding to at least a portion of a non-display area of the display panel; and a first sealing compensation layer below the organic spacer, wherein a lower surface of the organic spacer directly contacts the first sealing compensation layer.

20 Claims, 12 Drawing Sheets

200 : 210, 220

DISPLAY DEVICE AND METHOD OF MANUFACTURING THE SAME

CROSS-REFERENCE TO RELATED APPLICATION

The present application claims priority to and the benefit of Korean Patent Application No. 10-2023-0032778 filed on Mar. 13, 2023, in the Korean Intellectual Property Office, the entire disclosure of which is incorporated herein by reference.

BACKGROUND

1. Field

Aspects of some embodiments of the present disclosure relate to a display device and a method of manufacturing the same.

2. Description of the Related Art

A wearable device may include glasses or a helmet so that a focus is formed at a distance close to a user's eyes. For example, the wearable device may be a head mounted display (HMD) device or augmented reality (AR) glasses. The wearable device provides a user with an AR screen or a virtual reality (VR) screen.

The wearable device such as the HMD device or the AR glasses may desirably include a display specification of a minimum 2000 PPI (the number of pixels per inch) to allow a user to use it for a long period of time without dizziness. To this end, an organic light emitting diode on silicon (OLEDoS) technology, which is related to a high-resolution compact organic light emitting display device, has emerged. The OLEDoS technology is the technology for arranging an organic light emitting diode (OLED) on a semiconductor wafer substrate on which a complementary metal oxide semiconductor (CMOS) is located.

The above information disclosed in this Background section is only for enhancement of understanding of the background and therefore the information discussed in this Background section does not necessarily constitute prior art.

SUMMARY

Aspects of some embodiments of the present disclosure include a display device and a method of manufacturing the same, in which adhesion of a sealing member for bonding a display panel and an encapsulation substrate to each other and encapsulation performance are relatively improved.

According to some embodiments of the present disclosure, a display device may include a display panel including a semiconductor wafer substrate and an OLED on the semiconductor wafer substrate, an encapsulation substrate on the display panel, and a sealing member between the display panel and the encapsulation substrate to couple the display panel with the encapsulation substrate. According to some embodiments, a filler may be surrounded by the sealing member between the display panel and the encapsulation substrate. According to some embodiments, the sealing member may include an organic spacer corresponding to at least a portion of a non-display area of the display panel, and a first sealing compensation layer below the organic spacer. According to some embodiments, a lower surface of the organic spacer may be directly in contact with the first sealing compensation layer.

According to some embodiments, the display panel may include an encapsulation layer on the OLED, a color filter on the encapsulation layer, and a refractive film on the color filter.

According to some embodiments, the first sealing compensation layer may include a first compensation layer formed on the same layer as the color filter, and a second compensation layer on the first compensation layer and formed on the same layer as the refractive film.

According to some embodiments, the lower surface of the organic spacer may be directly in contact with an upper surface of the second compensation layer.

According to some embodiments, the display device may further include a second sealing compensation layer below the first sealing compensation layer.

According to some embodiments, the second sealing compensation layer may include at least a third compensation layer formed on the same layer as at least a portion of a plurality of electrodes included in a transistor below the OLED.

According to some embodiments, the plurality of electrodes included in the transistor may include a gate electrode, a source electrode and a drain electrode. According to some embodiments, the third compensation layer may be formed on the same layer as at least one of the gate electrode, the source electrode, or the drain electrode.

According to some embodiments, the second sealing compensation layer may further include at least a fourth compensation layer between the third compensation layer and the second compensation layer and formed on the same layer as a connection electrode electrically connecting the transistor with the OLED.

According to some embodiments, a lower surface of the first compensation layer may be directly in contact with an upper surface of the fourth compensation layer.

According to some embodiments, a plurality of metals included in the second sealing compensation layer may be floating electrodes that are not electrically connected to a plurality of metals in a display area of the display panel.

According to some embodiments of the present disclosure, a method of manufacturing a display device may include preparing a display panel including a semiconductor wafer substrate and an OLED on the semiconductor wafer substrate, preparing an encapsulation substrate on which an organic spacer corresponds to at least a portion of a non-display area of the display panel, coating a filler on one surface of the encapsulation substrate to correspond to a display area of the display panel, and bonding the encapsulation substrate coated with the filler to the display panel. According to some embodiments, a first sealing compensation layer may be directly in contact with the organic spacer in a non-display area of the display panel.

According to some embodiments, the display panel may include an encapsulation layer on the OLED, a color filter on the encapsulation layer, and a refractive film on the color filter.

According to some embodiments, preparing the display panel may include, as a step of forming the first sealing compensation layer, forming a first compensation layer on the same layer as the color filter, and forming a second compensation layer on the first compensation layer and forming the second compensation layer on the same layer as the refractive film.

According to some embodiments, the lower surface of the organic spacer may be directly in contact with an upper surface of the second compensation layer.

According to some embodiments, the display panel may further include a second sealing compensation layer below the first sealing compensation layer.

According to some embodiments, the second sealing compensation layer may include at least a third compensation layer formed on the same layer as at least a portion of a plurality of electrodes included in a transistor below the OLED.

According to some embodiments, the plurality of electrodes included in the transistor may include a gate electrode, a source electrode and a drain electrode. According to some embodiments, preparing the display panel may include forming a third compensation layer on the same layer as at least one of the gate electrode, the source electrode, or the drain electrode as a step of forming the second sealing compensation layer.

According to some embodiments, the forming the second sealing compensation layer may further include forming at least a fourth compensation layer between the third compensation layer and the second compensation layer on the same layer as a connection electrode electrically connecting the transistor with the OLED.

According to some embodiments, a lower surface of the first compensation layer may be directly in contact with an upper surface of the fourth compensation layer.

According to some embodiments, a plurality of metals included in the second sealing compensation layer may be floating electrodes that are not electrically connected to a plurality of metals in a display area of the display panel.

According to the display device and the method of manufacturing the same, adhesion of a sealing member for bonding a display panel and an encapsulation substrate to each other and encapsulation performance may be relatively improved.

However, aspects of embodiments according to the present disclosure are not restricted to those set forth herein. The above and other aspects of embodiments according to the present disclosure will become more apparent to one of ordinary skill in the art to which the present disclosure pertains by referencing the detailed description of the present disclosure given below.

BRIEF DESCRIPTION OF THE DRAWINGS

The above and other aspects and characteristics of embodiments according to the present disclosure will become more apparent by describing in more detail aspects of some embodiments thereof with reference to the attached drawings, in which.

DETAILED DESCRIPTION

Aspects of some embodiments of the present invention will now be described more fully hereinafter with reference to the accompanying drawings, in which aspects of some embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being “on” another layer or substrate, it can be directly on the other layer or substrate, or intervening layers may also be present. The same reference numbers indicate the same components throughout the specification.

It will be understood that, although the terms “first,” “second,” etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, aspects of some embodiments of the present disclosure will be described in more detail with reference to the accompanying drawings.

Figure 1:
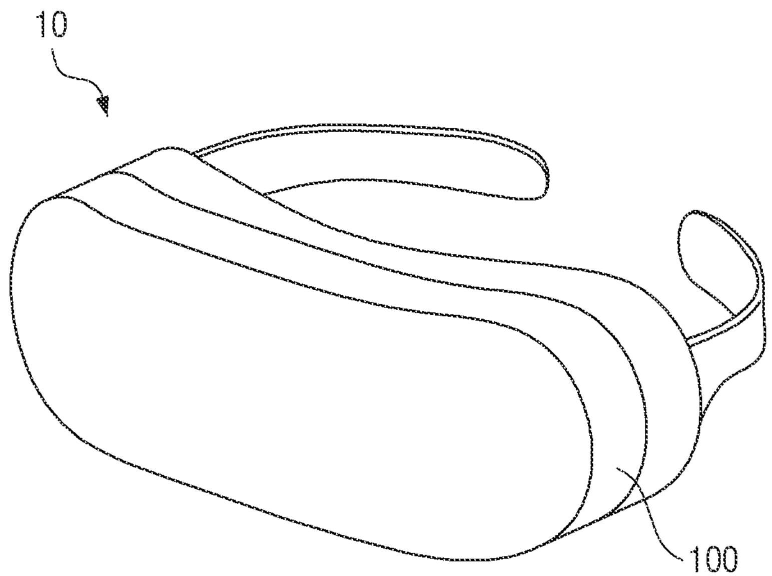
FIG. 1 is a front view illustrating a wearable device including a display device according to some embodiments.
Figure 2:
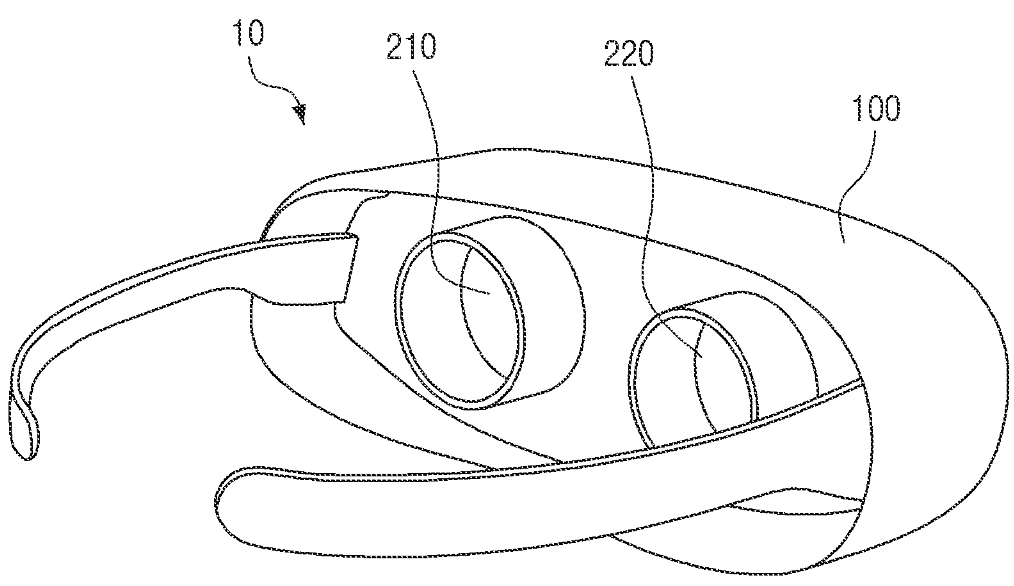
FIG. 2 is a rear view illustrating the wearable device shown in FIG. 1 according to some embodiments.

FIG. 1 is a front view illustrating a wearable device 100 including a display device 10 according to some embodiments. FIG. 2 is a rear view illustrating the wearable device 100 shown in FIG. 1.

Referring to FIGS. 1 and 2, the display device 10 according to some embodiments may be a display device included in a head-mounted display (HMD) device. In the HMD device, the display device 10 may be located inside a main body, and a lens 200 for displaying a screen (and/or images) may be located on a rear surface of the main body. The lens 200 may include a left-eye lens 210 corresponding to a left-eye of a user and a right-eye lens 220 corresponding to a right-eye of the user. Each of the left-eye lens 210 and the right-eye lens 220 may include a glasses for displaying a screen (and/or images) output from the display device 10.

Figure 3:
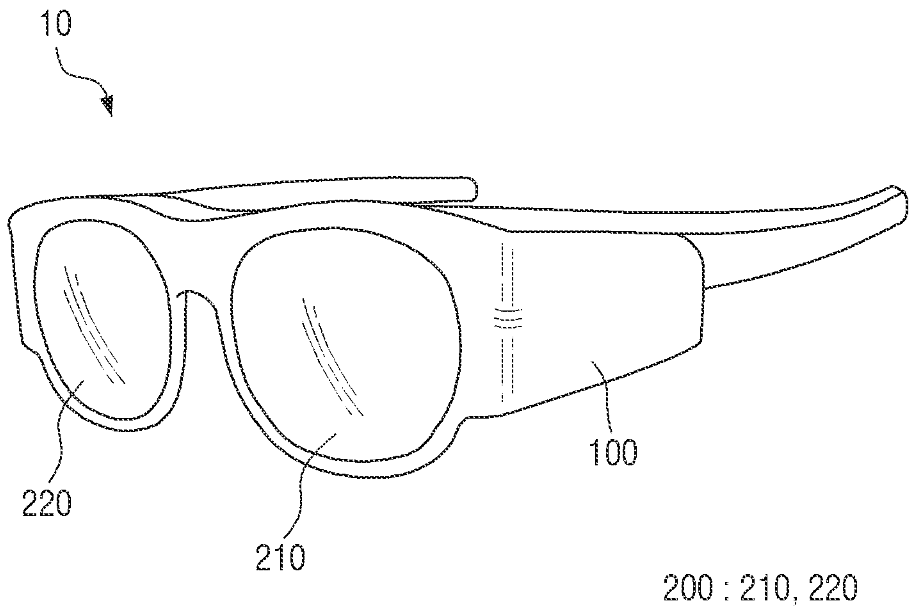
FIG. 3 is a view illustrating another example of a wearable device including a display device according to some embodiments.

FIG. 3 is a view illustrating another example of the wearable device 10 including the display device 10 according to some embodiments.

Referring to FIG. 3, the display device 10 according to some embodiments may be a display device included in augmented reality (AR) glasses. The AR glasses may have an eyeglasses shape, and may include a see-through (or transparent or translucent) lens. The see-through lens may include a left-eye lens 210 corresponding to a left-eye of a user and a right-eye lens 220 corresponding to a right-eye of the user. Each of the left-eye lens 210 and the right-eye lens 220 may include glasses for displaying the screen (and/or images) output from the display device 10.

Figure 4:
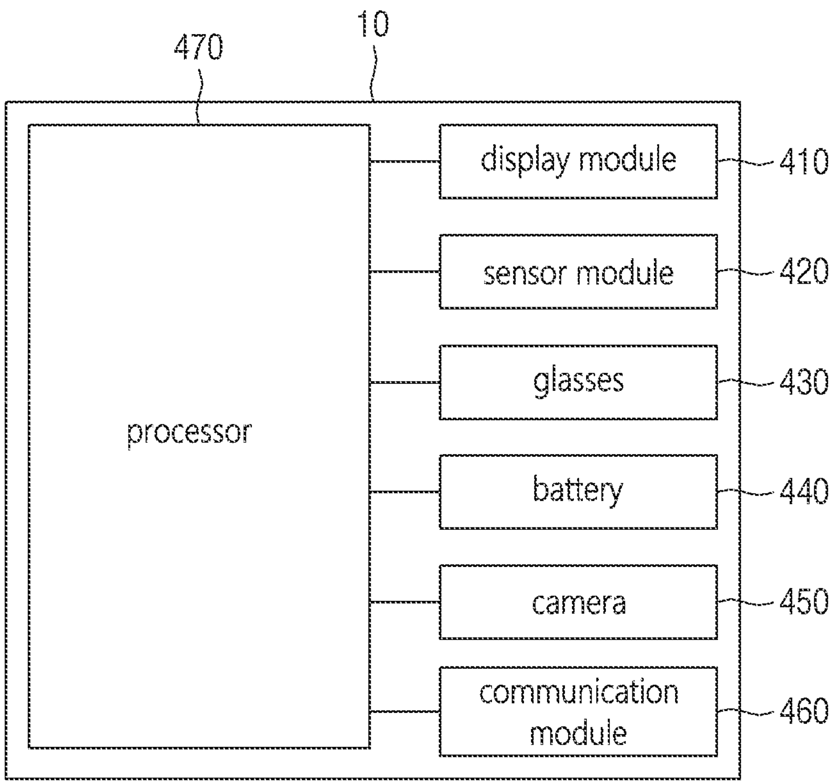
FIG. 4 is a schematic block view illustrating a display device according to some embodiments.
Figure 5:
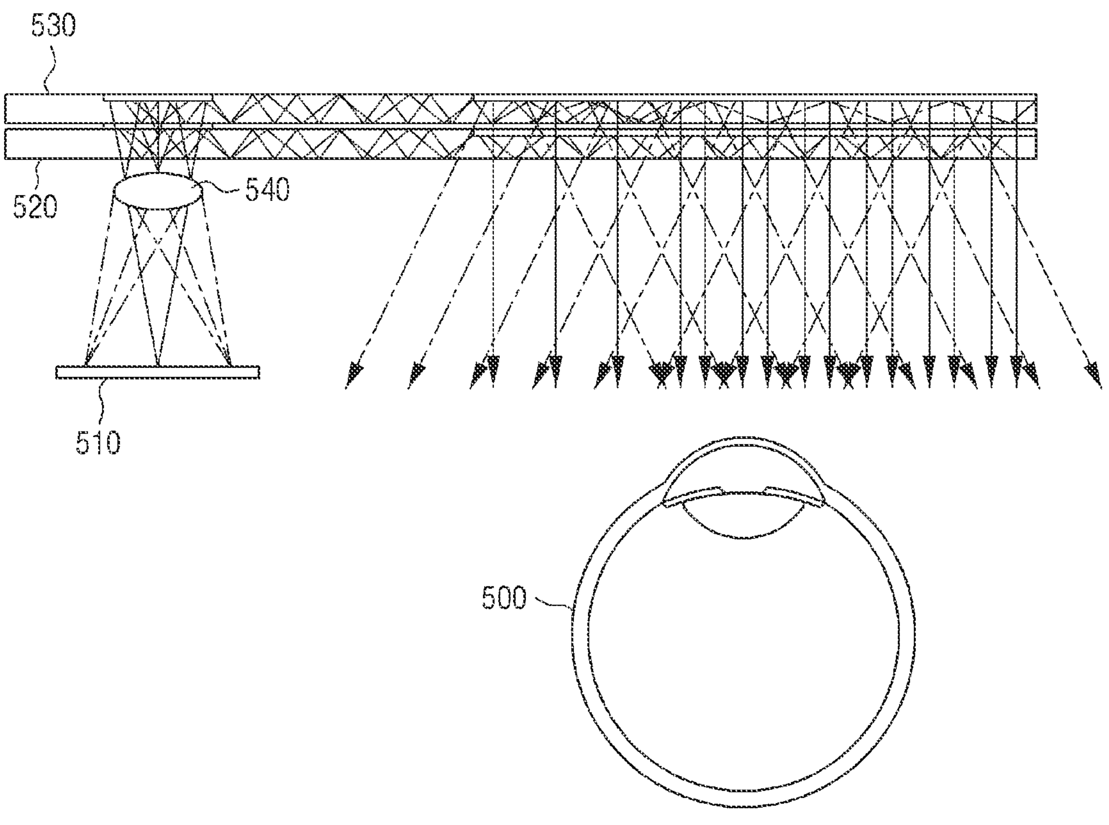
FIG. 5 is a schematic view illustrating a display module according to some embodiments.

FIG. 4 is a schematic block view illustrating a display device 10 according to some embodiments. FIG. 5 is a schematic view illustrating a display module according to some embodiments. For example, FIG. 5 illustrates an optical path through which display light output from a display panel 510 of the display device 10 moves or passes.

The display device 10 shown in FIGS. 4 and 5 may be applied to the HMD device shown in FIGS. 1 and 2 or the AR glasses shown in FIG. 3.

Referring to FIGS. 4 and 5, the display device 10 according to some embodiments may include a processor 470, a display module 410, a sensor module 420, a glasses 430, a battery 440, a camera 450, and a communication module 460. According to some embodiments, the display device 10 may further include other elements described in the present disclosure. The display device 10 may omit at least some elements shown in FIG. 4. That is, the display device 10 is not limited to the components illustrated in FIG. 4, and according to some embodiments, the display device 10 may include additional components or fewer components without departing from the spirit and scope of embodiments according to the present disclosure.

The processor 470 may execute command languages or program instructions stored in a memory to control operations of the elements (e.g., the display module 410, the sensor module 420, the battery 440, the camera 450, and the communication module 460) of the display device 10. The processor 470 may be electrically and/or operatively connected to the display module 410, the sensor module 420, the battery 440, the camera 450, and the communication module 460. The processor 470 may execute software or program instructions to control at least one other element (e.g., the display module 410, the sensor module 420, the battery 440, the camera 450, and the communication module 460) connected to the processor 470. The processor 470 may acquire a command from the elements included in the display device 10, interpret the acquired command, and process and/or compute various data in accordance with the interpreted command.

The display device 10 may receive the data processed through a processor 120 embedded in an external device (e.g., a smartphone or a tablet PC) from the external device. For example, the display device 10 may photograph an object (e.g., a real object or user's eyes) through the camera 450, and may transmit the photographed image to the external device through the communication module 460. The display device 10 may receive the data based on the image photographed by the display device 10 from the external device. The external device may generate image data related to augmented reality based on information (e.g., shape, color, or position) of the photographed object received from the display device 10, and may transmit the image data to the display device 10. The display device 10 may request additional information based on an image obtained by photographing an object (e.g., a real object or user's eyes) through the camera 450 to the external device, and may receive additional information from the external device.

The display module 410 may include a display panel (e.g., the display panel 510 of FIG. 5) and a light transfer member (e.g., waveguides 520 and 530) for transferring light emitted from the display panel 510 to a portion of the glasses 430. In the present disclosure, the display panel 510 may refer to a light source unit for generating display light input to the waveguides (e.g., 520 and 530 of FIG. 5). The display panel 510 may be a display panel to which an organic light emitting diode on silicon (OLEDoS) technology is applied. For example, the display panel may include an OLED located on a semiconductor wafer substrate on which a complementary metal oxide semiconductor (CMOS) is located.

The display panel 510 of the display module 410 may emit display light for displaying an augmented reality image (or a virtual reality image) based on the control of the processor 470. For example, the display light emitted from the display panel 510 may be transferred to a display area of the lens (200 of FIG. 2 or 200 of FIG. 3) through the waveguides 520 and 530 so that the user may see the display light. The display device 10 (e.g., the processor 470) may control the display panel 510 in response to the user's input. Types of the user's input may include a button input, a touch input, a voice input, and/or a gesture input, and may include various input methods capable of controlling an operation of the display panel 510 without being limited thereto.

The display device 10 may further include a light source unit to track movement of the user's eye 500. The light source unit may be configured to emit light different from the display light emitted by the display panel 510. The light source unit may be configured to irradiate near-infrared light having an output wavelength of about 780 nm to about 1400 nm to the user's eye. The near-infrared light emitted from the light source unit may be reflected from the user's eye 500, and the reflected near-infrared light may be input to the display panel 510. The display panel 510 is an optical sensor configured to receive near-infrared light reflected from the user's eye 500 and to track movement of the user's eye 500 by using the received near-infrared light, and may include a gaze tracking sensor. In this case, the gaze tracking sensor may include a photodiode located in a sensor pixel of the display panel 510.

When displaying an AR screen or a virtual reality (VR) screen, the display device 10 tracks the movement of the user's eyes by using the photodiode and varies resolution of a screen based on the tracked movement of the user's eyes. For example, the display device 10 detects a direction of the user's gaze and determines a central vision area corresponding to the gaze and a peripheral vision area except the central vision area. A foveated rendering technology for displaying a high-resolution screen on the central vision area and displaying a low-resolution screen on the peripheral vision area may be applied to the display device 10.

The glasses 430 may be arranged to correspond to the display area of the lens (200 of FIG. 2 or 200 of FIG. 3) of the wearable device. For example, the glasses 430 may be included in each of the left-eye lens (210 of FIG. 1 or 210 of FIG. 3) and the right-eye lens (220 of FIG. 1 or 220 of FIG. 3).

The glasses 430 may include waveguides 520 and 530 as reflective members, and the waveguides 520 and 530 may include at least one of a display waveguide 520 or a gaze tracking waveguide 530.

The display waveguide (e.g., first waveguide) 520 may form a path of light by inducing light such that the display light emitted from the display panel 510 is emitted to the display area of the lens (200 of FIG. 2 or 200 of FIG. 3). For example, the display area of the lens (200 of FIG. 2 or 200 of FIG. 3) may be an area to which light propagated inside the display waveguide 520 is emitted.

The display waveguide 520 may include at least one of at least one diffractive element or a reflective element (e.g., a reflective mirror). The display waveguide 520 may induce the display light emitted from the display panel 510 to the user's eye 500 by using at least one diffractive element or the reflective element, which is included in the display waveguide 520. For example, the diffractive element may include input/output grating, and the reflective element may include total internal reflection (TIR). An optical material (e.g., glass, plastic, etc.) of the display waveguide may be processed in the form of a wafer, so that the optical material may be used as the display waveguide 520, and a refractive index of the display waveguide 520 may vary from about 1.5 to about 1.9.

The display waveguide 520 may include a material (e.g., glass or plastic) capable of totally reflecting the display light in order to induce the display light to the user's eye 500. The material of the display waveguide 520 may not be limited to the aforementioned examples.

The display waveguide 520 may split the display light emitted from the display panel 510 in accordance with a wavelength (e.g., blue, green, or red) to move to a separate path in the display waveguide 520, respectively.

The display waveguide 520 may be located in a portion of the glasses 430. For example, the display waveguide 520 may be located on an upper end of the glasses 430 based on a virtual axis in which a center point of the glasses 430 and a center point of the user's eye 500 are matched with each other and a virtual line orthogonal to the virtual axis at the center point of the glasses 430. The area in which the display waveguide 520 is located may not be limited to the above-described area of the glasses 430, and the area in which the display waveguide 520 is located may be located in any one of the areas of the glasses 430 such that the amount of light reflected in the user's eye 500 is greater than or equal to a reference value.

The sensor module 420 may include at least one sensor (e.g., a gaze tracking sensor and/or an illuminance sensor). The at least one sensor may not be limited to the above-described example. For example, the at least one sensor may further include a proximity sensor or a contact sensor, which is capable of sensing whether or not the user has worn the display device 10. The display device 10 may sense whether or not the user wears the display device 10, through the proximity sensor or the contact sensor. When sensing that the user wears the display device 10, the display device 10 may be manually and/or automatically paired with another electronic device (e.g., a smart phone, a tablet personal computer (PC), etc.).

The gaze tracking sensor may sense the reflective light reflected from the user's eye 500 based on the control of the processor 470. The display device 10 may convert the reflective light sensed through the gaze tracking sensor into an electrical signal. The display device 10 may acquire the user's eyeball image through the converted electrical signal. The display device 10 may track the user's gaze by using the acquired eyeball image of the user.

The illuminance sensor may sense illuminance (or brightness) near the display device 10, the amount of the display light emitted from the display panel, brightness near the user's eye 500, or the amount of the reflective light reflected in the user's eye 500 based on the control of the processor 470.

The display device 10 may sense illuminance (or brightness) near the user by using the illuminance sensor. The display device 10 may adjust the amount of light (or brightness) of a display (e.g., the display panel 510) based on the sensed illuminance (or brightness).

The gaze tracking waveguide (e.g., the second waveguide) 530 may form a path of light by inducing light such that the reflective light reflected from the user's eye 500 is input to the sensor module 420. The gaze tracking waveguide 530 may be used to transfer the reflective light to the gaze tracking sensor. The gaze tracking waveguide 530 may be formed as an element the same as or different from the display waveguide 520.

The gaze tracking waveguide 530 may be located in a portion of the glasses 430. For example, based on a virtual axis, in which the center point of the glasses 430 and the center point of the user's eye 500 are matched with each other, and a virtual line orthogonal to the virtual line at the central point of the glasses 430, the gaze tracking waveguide 530 may be located on a lower end of the glasses 430. An area in which the gaze tracking waveguide 530 is located may not be limited to the above-described area of the glasses 430, and may be located in any one of the areas of the glasses 430.

The battery 440 may supply power to at least one element of the display device 10. The battery 440 may be charged by being connected to an external power source in a wired or wireless manner or configuration.

The camera 450 may photograph an image near the display device 10. For example, the camera 450 may photograph an image of the user's eye 500 or photograph a real object image outside the display device 10.

The communication module 460 may include a wired interface or a wireless interface. The communication module 460 may support direct communication (e.g., wired communication) or indirect communication (e.g., wireless communication via a wireless network communication protocol) between the display device 10 and the external device (e.g., smartphone, or tablet PC).

The communication module 460 may include a wireless communication module (e.g., a cellular communication module, a short-range wireless communication module, or a global navigation satellite system (GNSS) communication module) or a wired communication module (e.g., a local area network (LAN) communication module or a power line communication module).

The wireless communication module may support a 5G network after a 4G network and a next generation communication technology, for example, a new radio (NR) access technology. The NR access technology may support high-speed data transmission of high-capacity data (enhanced mobile broadband (eMBB)), minimization of terminal power, massive machine type communications (mMTC), or ultra-reliable and low-latency communications (URLLC). The wireless communication module 192 may support, for example, a high frequency band (e.g., mmWave band) for achieving a high data transmission rate.

The wireless communication module may include a short-range wireless communication module. The short-range communication may include at least one of wireless fidelity (WiFi), Bluetooth®, Bluetooth® low energy (BLE), Zigbee®, near field communication (NFC), magnetic secure transmission, radio frequency (RF), or body area network (BAN).

Referring to FIG. 5, the display module 410 includes a display panel 510 for outputting display light, waveguides 520 and 530, and a projection lens 540.

The projection lens 540 may be configured to input light emitted from the display panel 510 into the waveguides 520 and 530. In FIG. 5, a portion of light flux emitted from the display panel 510 is input to the waveguides 520 and 530 through the projection lens 540.

The waveguides 520 and 530 may have a plate shape. The waveguides 520 and 530 may include grating that performs a diffraction function, such as diffraction optical elements (DOE) or holographic optical elements (HOE), in a partial area of the plate. A period, depth or refractive index of the grating of the waveguides 520 and 530 may be varied based on conditions such as an output image viewing angle or a refractive index of a plate medium. The waveguides 520 and 530 may distribute an optical signal so that a portion of the optical signal (i.e., display light) input from the display panel 510 is transferred into the waveguide 530 and another portion of the optical signal is output to the outside of the waveguides 520 and 530.

In FIG. 5, the diffraction optical element has been described as an example of the waveguides 520 and 530, but the waveguide may be replaced with a reflective optical element such as a beamsplitter.

Figure 6:
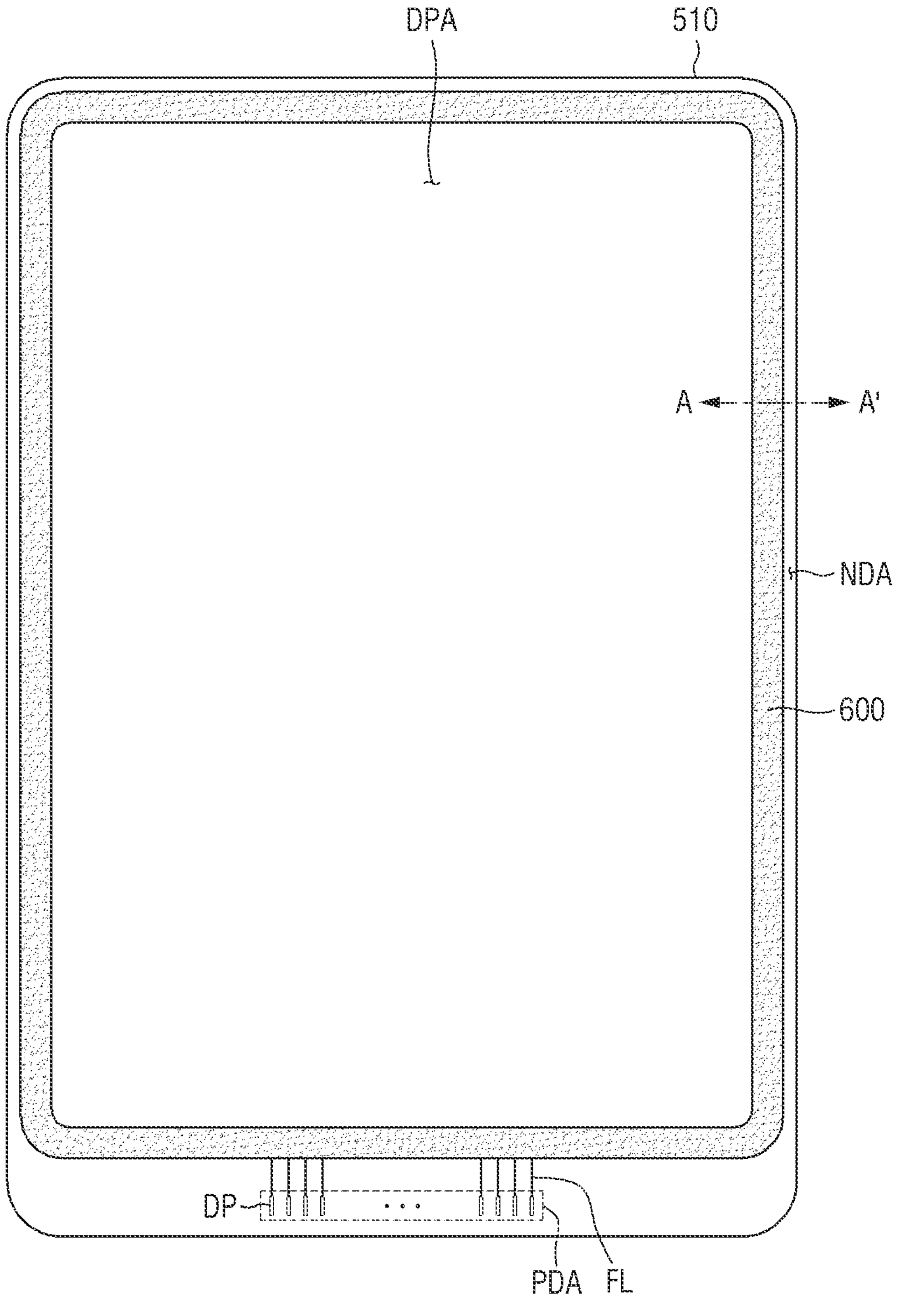
FIG. 6 is a plan view illustrating a display panel according to some embodiments.

FIG. 6 is a plan view illustrating a display panel 510 according to some embodiments.

Referring to FIG. 6, a display panel 510 may include a display area DPA and a non-display area NDA. The display area DPA is an area in which a plurality of pixels for emitting display light are located. The non-display area NDA may be an area located outside the display area DPA. The display area DPA may be referred to as an active area, and the non-display area NDA may be referred to as a non-active area.

The non-display area NDA may be an area fully or partially surrounding the display area DPA. For example, the display area DPA may have a quadrangular shape, and the non-display area NDA may be arranged to be adjacent to four boundary portions (e.g., four sides) of the display area DPA. The non-display area NDA may form a bezel of the display panel 510.

The display panel 510 may be formed in a plane of a quadrangular shape. A corner area at which a long side and a short side of the display panel 510 meet may be formed to be rounded or at a right angle. The shape of the display panel 510 is not limited to the quadrangular shape, and may be formed in another polygonal shape, a circular shape, or an oval shape.

A partial area of the non-display area NDA of the display panel 510 may be referred to as a pad area PDA. For example, the pad area PDA may be arranged to be adjacent to one side (e.g., a side positioned in a lower direction in the display panel 510 of FIG. 6) of the display panel 510. A plurality of display pads DP electrically connected to a plurality of pixels located in the display area DPA through a plurality of fan-out lines FL may be located in the pad area PDA. The plurality of display pads DP may be electrically connected to a display driving circuit. For example, the display driving circuit may be referred to as a "display driver". The display driver may be formed of an integrated circuit (IC), and may be electrically connected to the pad area PDA of the display panel 510. For example, the display driver may be adhered to the pad area PDA of the display panel 510 in a chip on glass (COG) method, a chip on plastic (COP) method, or an ultrasonic bonding method. Meanwhile, according to some embodiments, a partial area of the non-display area NDA of the display panel 510 may be connected to a display circuit board. The display circuit board may be a flexible printed circuit board, a printed circuit board, or a flexible film such as a chip on film.

A sealing member 600 for coupling the display panel 510 and an encapsulation substrate (e.g., EG to FIG. 10) to each other may be located in the non-display area NDA of the display panel 510. The sealing member 600 may be arranged to surround the outside of the display area DPA in the non-display area NDA of the display panel 510. A filler FI may be located inside the sealing member 600 to encapsulate the OLED included in the display panel 510. For example, the filler FI may be located between the display panel 510 and the encapsulation substrate EG, and may be arranged to be surrounded by the sealing member 600. Meanwhile, the above-described pad area PDA is located outside the sealing member 600, so that it may not be covered by the filler (FI of FIG. 7). Therefore, the plurality of display pads DP located in the pad area PDA may not be covered by the filler.

The encapsulation substrate EG is a substrate located on the display panel 510, and may be a transparent plate or a transparent film. The encapsulation substrate EG may be arranged to face the display panel 510. The encapsulation substrate EG may serve to protect an emission layer (EL of FIG. 10) included in the display panel 510 together with the above-described sealing member 600 from external moisture or air. For example, the sealing member 600 may encapsulate a space between the display panel 510 and the encapsulation substrate EG, and the filler FI may be located inside the space. Therefore, inflow of external moisture or air into the emission layer EL located in the display area DPA may be blocked.

The sealing member 600 may include an organic spacer (OS of FIG. 7) containing an organic material. The sealing member 600 may be a cured frit. In the present disclosure, 'frit' may refer to a structure having glass characteristics, which is formed by melt-curing a powder-type glass to which an additive is selectively added. Hereinafter, the description will be based on that the material of the sealing member 600 is a cured frit, but embodiments according to the present disclosure are not limited thereto, and various modifications may be made in the material of the sealing member 600.

Meanwhile, the sealing member 600 according to some embodiments of the present disclosure includes an organic spacer OS and at least one sealing compensation layer (SC1 of FIG. 7 and SC2 of FIG. 11) located below the organic spacer OS to compensate for a height of the organic spacer OS. Hereinafter, the sealing member 600 according to some embodiments will be described in more detail with reference to FIGS. 7 to 12.

Figure 7:
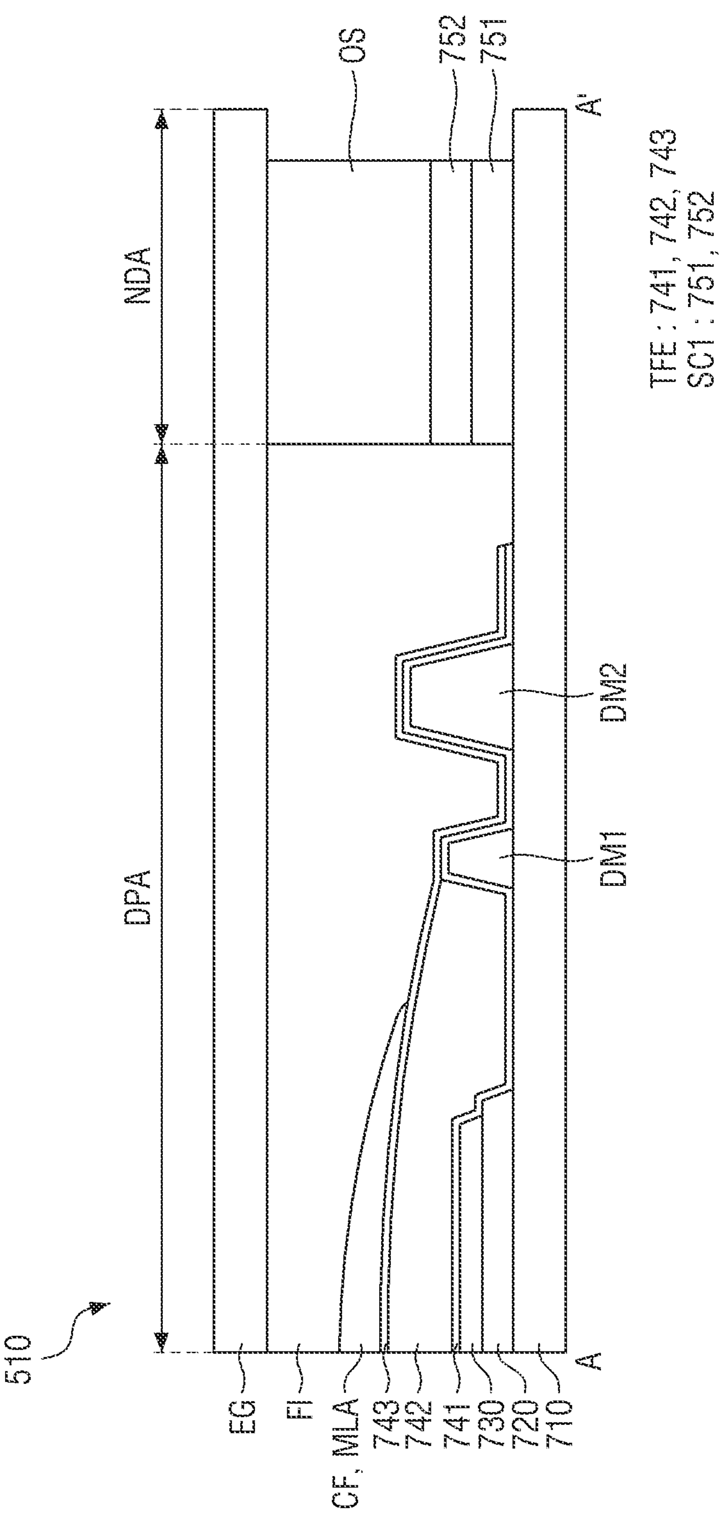
FIG. 7 is a cross-sectional view illustrating a portion of a display panel, which is taken along the line A-A' of FIG. 6 according to some embodiments.
Figure 8:
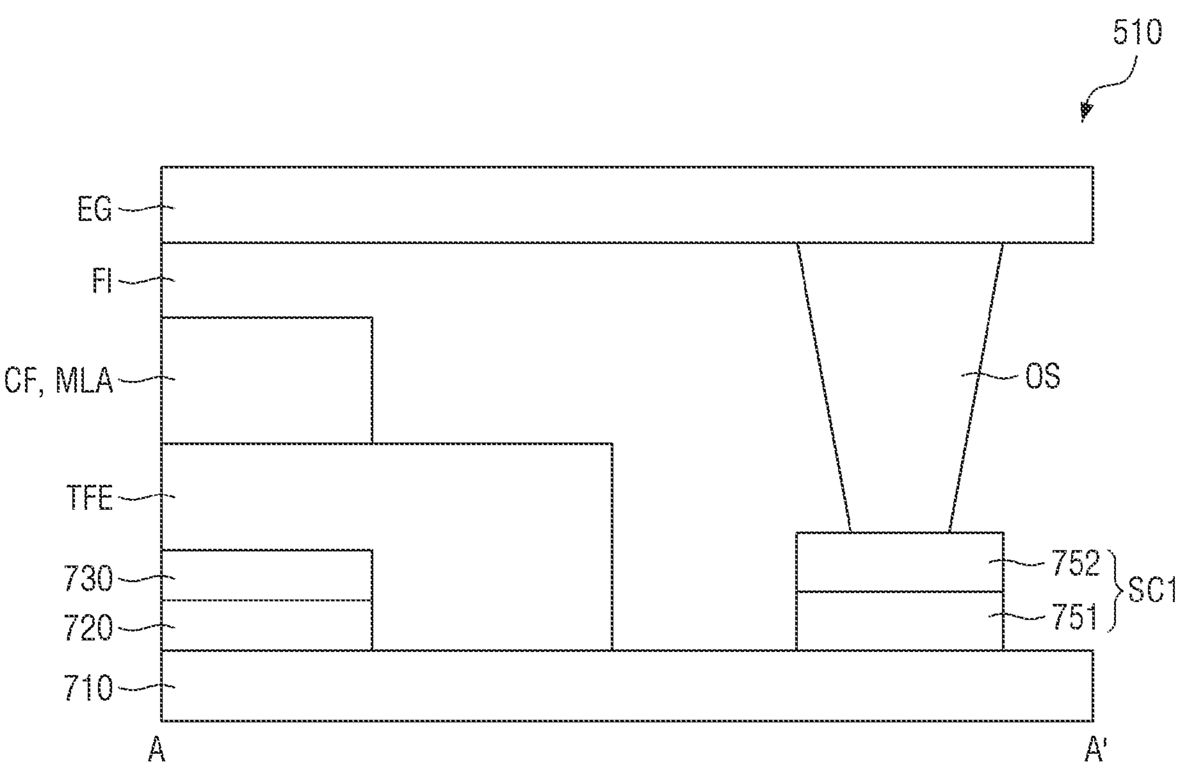
FIG. 8 is a cross-sectional view schematically illustrating a portion of a display panel, which is taken along the line A-A' of FIG. 6 according to some embodiments.

FIG. 7 is a cross-sectional view illustrating a portion of a display panel 510, which is taken along the line A-A' of FIG. 6. FIG. 8 is a cross-sectional view schematically illustrating a portion of a display panel 510, which is taken along the line A-A' of FIG. 6.

Referring to FIGS. 7 and 8, the display panel 510 includes a semiconductor wafer substrate 710. A circuit layer 720 including a transistor (TR of FIG. 10) for driving the plurality of pixels (P of FIG. 9) located in the display area DPA may be formed on the semiconductor wafer substrate 710, and an OLED 730 including an emission layer EL may be located on the circuit layer 720.

A thin-film encapsulation layer TFE covering the OLED 730 may be located on the OLED 730. The thin-film encapsulation layer TFE includes at least one organic layer 742 and at least one inorganic layers 741 and 743. For example, the thin-film encapsulation layer TFE may include a first inorganic layer 741 located on the OLED, an organic layer 742 located on the first inorganic layer 741, and a second inorganic layer 743 located on the organic layer 742. However, a stacked structure of the organic layer and the inorganic layer, which are included in the thin-film encapsulation layer TFE, is not limited to the shown example, and may be variously changed.

A color filter CF and a refractive layer MLA may be located on the thin-film encapsulation layer TFE. For example, the emission layer EL is configured to emit white light, and the white light emitted from the emission layer EL may be converted into light of a designated color by transmitting the color filter CF. The plurality of pixels P may include a red pixel configured to emit red light, a green pixel configured to emit green light, and a blue pixel configured to emit blue light. To this end, the red pixel may include a red color filter (CF1 of FIG. 10), the green pixel may include a green color filter (CF3 in FIG. 10), and the blue pixel may include a blue color filter (CF3 of FIG. 10). The following description will be based on that the color filter includes a red color filter, a green color filter and a blue color filter, but embodiments according to the present disclosure are not limited thereto.

The refractive layer may include a refractive film MLA for increasing front emission efficiency of the display panel 510. The refractive film MLA may be referred to as a refractive pattern. The refractive pattern may be designed to have a lens shape, and may refract incident light such that light emitted from the emission layer is directed toward a normal direction of the display panel 510. The refractive film MLA may be referred to as a light control pattern.

For reference, the display panel 510 applied to the wearable device 100 such as an HMD device or an AR glasses is designed to have ultra-high resolution of minimum 2000 PPI (the number of pixels per inch), and thus front emission efficiency directed toward a front direction (e.g., upward direction in FIG. 7) of the display panel 510 is important. The refractive layer is a layer included in the display panel 510 to increase front emission efficiency. In the present disclosure, "front emission efficiency" may mean that the intensity of light emitted in a direction perpendicular to an upper surface of the display panel 510 is relatively strong. The display panel 510 includes a refractive layer (that is, refractive film MLA), and thus the intensity of light emitted in the normal direction of the display panel 510 may be higher than that of light emitted at an acute angle from the normal direction of the display panel 510.

As described above, the filler FI may be filled between the display panel 510, in which the semiconductor wafer substrate 710, the circuit layer 720, the OLED 730, the thin-film encapsulation layer TFE, the color filter CF and the refractive layer (i.e., the refractive film MLA) are sequentially stacked, and the encapsulation substrate EG, and the outside of the filler FI may be sealed by the sealing member 600.

Meanwhile, at least one dam may be located outside the display area DPA adjacent to the sealing member 600. For example, the display panel 510 may include a first dam DM1 located outside the display area DPA adjacent to the sealing member 600, and a second dam DM2 located between the first dam DM1 and the sealing member 600. Although FIG. 7 illustrates two dams, embodiments according to the present disclosure are not limited thereto. The first dam DM1 and the second dam DM2 may be formed by combination of at least one of a plurality of insulating layers included in the display panel 510 and at least one of a plurality of metal layers included in the display panel 510. For example, the first dam DM1 and the second dam DM2 may be manufactured by the same process using the same material as that of a pixel defining layer (PDL of FIG. 10) partitioning the plurality of pixels P and/or a spacer (SP of FIG. 10) (or barrier). The dams may serve to prevent the organic layer included in the thin-film encapsulation layer TFE from being diffused into the outside.

Referring to FIGS. 7 and 8, the sealing member 600 according to some embodiments includes an organic spacer OS formed of an organic material, and a first sealing compensation layer SC1 located below the organic spacer OS. A lower surface of the organic spacer OS may be arranged to be directly in contact with the first sealing compensation layer SC1.

The first sealing compensation layer SC1 serves to compensate for a height of the organic spacer OS. For example, the first sealing compensation layer SC1 serves to increase a height of a lower structure that overlaps the organic spacer OS during a bonding process of the encapsulation substrate EG and the display panel 510. The first sealing compensation layer SC1 may prevent a defect in which the filler FI overflows to the outside (e.g., the pad area PDA) of the sealing member 600 during the bonding process of the encapsulation substrate EG and the display panel 510. As the display panel 510 according to the present disclosure includes the first sealing compensation layer SC1 which is a lower structure overlapped with the organic spacer OS, a width of the organic spacer OS may be reduced to reduce a bezel width. Therefore, the present disclosure may expect high encapsulation performance while reducing the bezel width by reducing the width of the organic spacer OS.

According to some embodiments, the first sealing compensation layer SC1 may be manufactured by the same process using the same material as that of the color filter and the refractive film MLA of the display panel 510. For example, the first sealing compensation layer SC1 may include a first compensation layer 751 manufactured by the same process using the same material as that of the color filter CF, and a second compensation layer 752 located on the first compensation layer 751 and manufactured by the same process using the same material as that of the refractive film MLA. In this case, the lower surface of the organic spacer OS may be directly in contact with an upper surface of the second compensation layer 752.

Figure 9:
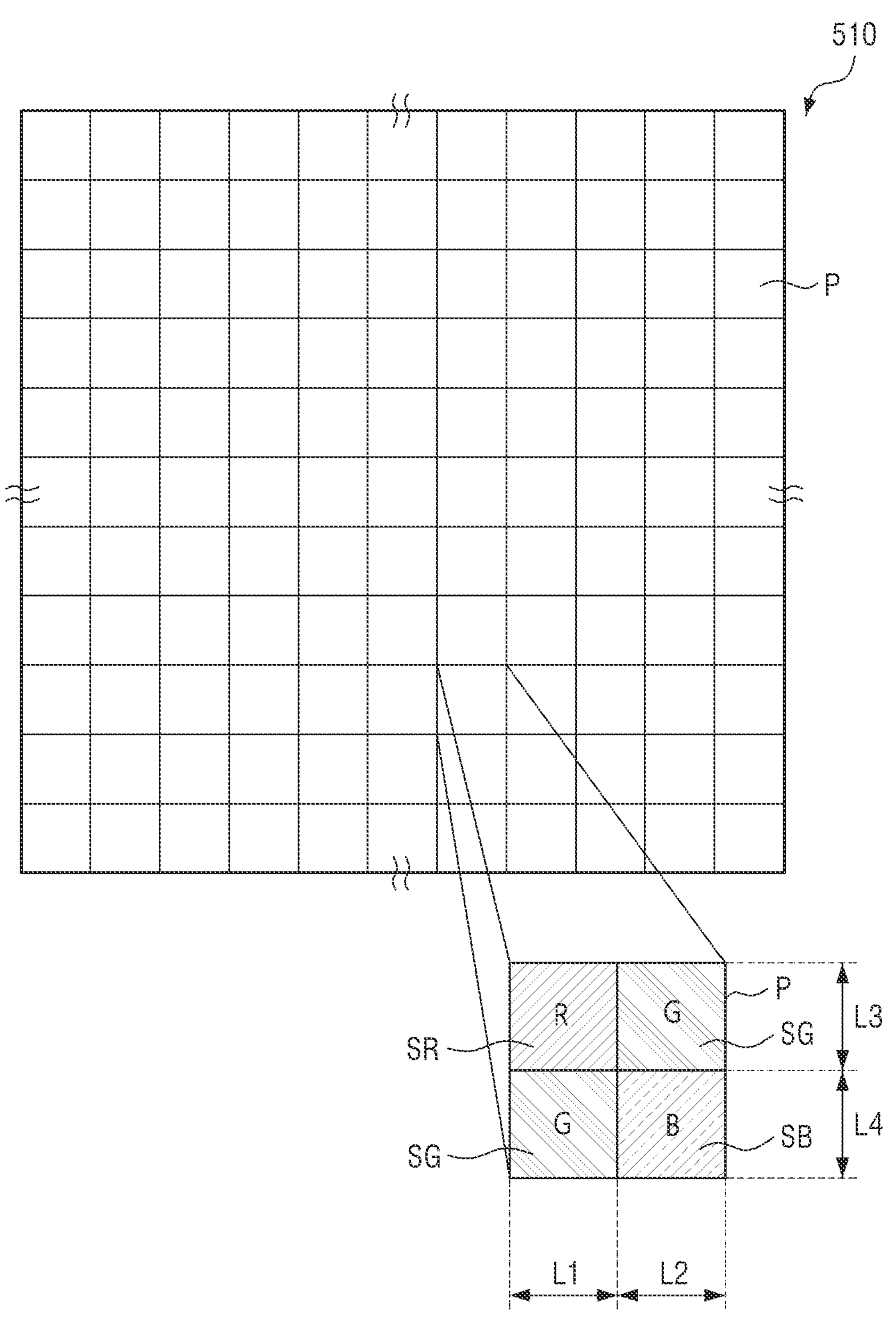
FIG. 9 is a plan view illustrating a portion of a display area of the display panel of FIG. 6 according to some embodiments.

FIG. 9 is a plan view illustrating a portion of the display area DPA of the display panel 510 of FIG. 6.

Referring to FIG. 9, a plurality of pixel groups P may be located in the display area DPA of the display panel 510 according to some embodiments. The plurality of pixel groups P may be arranged on a plane of the display panel 510 in the form of a matrix. For example, the display panel 510 may include m*n pixel groups P (e.g., unit pixels). In this case, each of m and n may be an integer greater than 1. In the present document, sign * denotes a multiplication operation code.

Each of the plurality of pixel groups P may be divided into i*i sub-areas, and at least one of a first color pixel, a second color pixel, or a third color pixel may be located in the sub-areas. For example, the first color pixel may be a red pixel SR, the second color pixel may be a green pixel SG, and the third color pixel may be a blue pixel SB. In this case, i may be an integer greater than 1. For example, one pixel group P includes 2*2 sub-areas, and any one of the red pixel SR, the green pixel SG and the blue pixel SB may be located in each of the sub-areas. The red pixel SR, the green pixel SG, and the blue pixel SB may have substantially the same area.

Each of the red pixel SR, the green pixel SG and the blue pixel SB may have a horizontal and vertical ratio of 1 to 1. For example, it may be assumed that a horizontal width of a first column in which the red pixel SR and the green pixel SG are arranged has a first length L1, a horizontal width of a second column in which the green pixel SG and the blue pixel SB are arranged has a second length L2, a vertical width of a first row in which the red pixel SR and the green pixel SG are arranged has a third length L3, and a vertical width of a second row in which the green pixel SG and the blue pixel SB are arranged has a fourth length L4. In this case, the first length L1, the second length L2, the third length L3, and the fourth length L4 may be all the same. The present disclosure is not limited to the shown example in which each of the red pixel SR, the green pixel SG and the blue pixel SB has a horizontal and vertical ratio of 1 to 1. For example, the areas of the red pixel SR, the green pixel SG and the blue pixel SB are different from one another, and the horizontal and vertical ratios of the red pixel SR, the green pixel SG, and the blue pixel SB may be different from one another. In this case, at least some lengths of the first length L1, the second length L2, the third length L3 and the fourth length L4 may have different values.

FIG. 9 illustrates that one pixel group P includes one red pixel SR, two green pixels SG and one blue pixel SB, but the arrangement of pixels included in each pixel group P may be variously changed and designed. For example, each pixel group P may include at least one red pixel SR, at least one green pixel SG, and at least one blue pixel SB.

Figure 10:
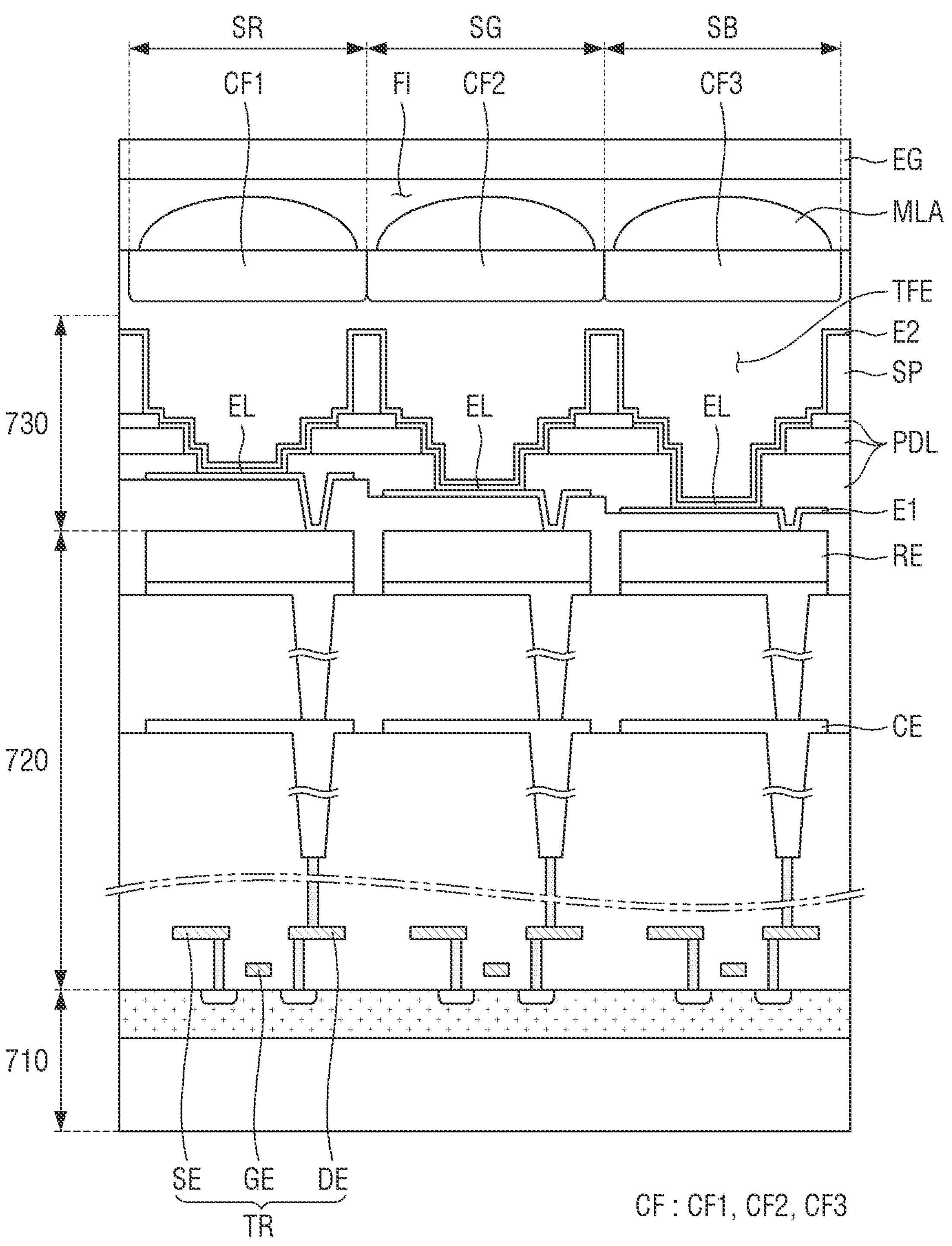
FIG. 10 is a cross-sectional view illustrating a light emission area of a display panel according to some embodiments.

FIG. 10 is a cross-sectional view illustrating a light emission area of a display panel 510 according to some embodiments. For example, FIG. 10 shows a cross-section of each of the red pixel SR, the green pixel SG and the blue pixel SB, which are shown in FIG. 9.

Referring to FIG. 10, the display panel 510 may include a semiconductor wafer substrate 710, a circuit layer 720 including a transistor located on the semiconductor wafer substrate 710, and an OLED 730 located on the circuit layer 720. As described above, a thin-film encapsulation layer TFE may be formed on the OLED 730, and a color filter and a refractive film MLA may be located on the thin-film encapsulation layer TFE. A filler FI may be filled between the display panel 510 and the encapsulation substrate EG.

The semiconductor wafer substrate 710 may include a silicon substrate. For example, the semiconductor wafer substrate 710 may be a semiconductor pattern formed on a silicon substrate. The semiconductor wafer substrate 710 may include any one of a monocrystalline silicon wafer, a polycrystalline silicon wafer, and/or an amorphous silicon wafer.

A circuit layer 720 including a transistor TR may be located on the semiconductor wafer substrate 710. The transistor TR may include a gate electrode GE, a source electrode SE, and a drain electrode DE. The transistor TR may be configured to independently control the red pixel SR, the green pixel SG and the blue pixel SB, which are included in each of the plurality of pixel groups P. At least one connection electrode CM electrically connected to the transistor TR, and conductive lines may be further located on the transistor TR. For example, the transistor TR located on the semiconductor wafer substrate 710 may be electrically connected to at least one connection electrode CE through at least one contact hole, and the connection electrode CE may be electrically connected to the OLED 730.

Meanwhile, a reflective electrode RE is located between the OLED 730 and the connection electrode CE to reflect light emitted from the OLED 730. The reflective electrode RE may be electrically connected to the first electrode E1 of the OLED 730, for example, an anode electrode, through a contact hole. Therefore, the transistor RE may be electrically connected to the first electrode E1 of the OLED 730, for example, the anode electrode via at least one connection electrode CE and the reflective electrode RE.

The OLED, which includes a first electrode E1, an emission layer EL, and a second electrode E2, may be located on the semiconductor wafer substrate 700.

The first electrodes E1 may be electrically connected to the transistor TR through the connection electrode CM of the semiconductor wafer substrate 700 and at least one contact hole connected thereto. The first electrodes E1 may be anode electrodes for driving the emission layer EL of each of the red pixel SR, the green pixel SG and the blue pixel SB. The first electrodes E1 may be reflective electrodes. For example, the first electrodes E1 may reflect light emitted from the emission layer EL toward a downward direction. The first electrodes E1 may include a metal material having high light reflectance. For example, the first electrodes E1 may include any one of Al, Al/Cu and Al/TiN.

The emission layer EL may be located on the first electrodes E1. The emission layer EL may include a single layer or a plurality of stacked structures. The emission layer EL may be configured to emit white light. The white light may be, for example, light in which blue light, green light, and red light are mixed. Alternatively, the white light may be light in which blue light and yellow light are mixed. According to some embodiments, the emission layer EL may be configured to emit color light not the white light. For example, the emission layer EL may emit red light from the red pixel SR, emit green light from the green pixel SG and emit blue light from the blue pixel SR. However, the following description will be based on that the emission layer EL emits white light for convenience of description.

The second electrode E2 may be located on the emission layer EL. The second electrode E2 may be a common electrode, for example, a cathode electrode. The second electrode E2 may be a transmissive or transflective electrode. For example, the second electrode E2 may transmit light emitted from the emission layer EL. The second electrode E2 may include a conductive material. For example, the second electrode E2 may include Li, Ca, LiF/Ca, LiF/Al, Al, Mg, BaF, Ba, Ag, Au, Cu, or their compound or mixture, which has a low work function.

The thin-film encapsulation layer TFE may be located on the OLED 730. The thin-film encapsulation layer TFE may be configured to encapsulate the emission layer EL so that oxygen or moisture may be prevented from being permeated into the emission layer EL. The thin-film encapsulation layer TFE may be located on an upper surface and sides of the emission layer EL. The thin-film encapsulation layer TFE may include at least one inorganic layer to prevent oxygen or moisture from being permeated into the emission layer EL. In addition, the thin-film encapsulation layer TFE may include at least one organic layer to protect the emission layer EL from particles such as dust. The inorganic layer of the thin-film encapsulation layer TFE may be formed of a multi-layer in which one or more inorganic layers of a silicon nitride layer, a silicon oxynitride layer, a silicon oxide layer, a titanium oxide layer and an aluminum oxide layer are alternately stacked. The organic layer of the thin-film encapsulation layer TFE may be an organic layer such as an acryl resin, an epoxy resin, a phenolic resin, a polyamide resin, or a polyimide resin.

The red pixel SR includes a red color filter CF1, and is configured to emit red light as the red color filter CF1 transmits the red light. According to some embodiments, the red pixel SR may be configured so that the emission layer EL directly emits red light, and in this case, the red color filter CF1 may be omitted.

The green pixel SG includes a green color filter CF2, and is configured to emit green light as the green color filter CF2 transmits green light. According to some embodiments, the green pixel SG may be configured so that the emission layer EL directly emits green light, and in this case, the green color filter CF2 may be omitted.

The blue pixel SB includes a blue color filter CF3, and is configured to emit blue light as the blue color filter CF3 transmits blue light. According to some embodiments, the blue pixel SB may be configured so that the emission layer EL directly emits blue light, and in this case, the blue color filter CF3 may be omitted.

Meanwhile, according to some embodiments, the display panel 510 may further include a sensor pixel. The sensor pixel includes a photodiode, and may sense reflective light reflected from the user's eye 500. The photodiode may convert the sensed reflective light into an electrical signal and supply the converted electrical signal to a sensor module 420. Such a sensor pixel may serve to track movement of the user's eye.

The encapsulation substrate EG may be located on the color filters CF: CF1, CF2 and CF3. The encapsulation substrate EG may be attached onto the color filters CF: CF1, CF2, and CF3 by a transparent adhesive member such as an optically clear adhesive (OCA) film.

A refractive film MLA for increasing front emission efficiency of the display panel 510 may be located between the color filters CF: CF1, CF2 and CF3 and the encapsulation substrate EG. The refractive film MLA may be designed to have a lens shape, and may refract incident light such that light emitted from the emission layer is directed toward a normal direction of the display panel 510. The refractive film MLA may be referred to as a light control pattern.

A reference numeral PDL, which is not described in FIG. 10, may be a pixel defining layer for partitioning the plurality of pixels.

A reference numeral SP, which is not described in FIG. 10, may be a spacer located on the pixel defining layer PDL. The spacer SP may be referred to as a barrier or a separator. The spacer SP may serve to increase front emission efficiency by reflecting incident light such that light emitted from the emission layer EL is directed toward the normal direction of the display panel 510.

The pixel defining layer PDL and the spacer SP may be formed of an organic layer such as acryl resin, epoxy resin, phenolic resin, polyamide resin, and polyimide resin.

The sealing member 600 of the display panel 510 according to some embodiments includes an organic spacer OS and a first sealing compensation layer SC1, and may further include a second sealing compensation layer SC2. The second sealing compensation layer SC2 is a layer located below the first sealing compensation layer SC1. For example, the second sealing compensation layer SC2 is a layer located between the organic spacer OS and the first sealing compensation layer SC1, and serves to further compensate for the height of the organic spacer OS. Hereinafter, the sealing member 600 of the display panel 510, which includes the second sealing compensation layer SC2, will be described with reference to FIGS. 11 and 12.

Figure 11:
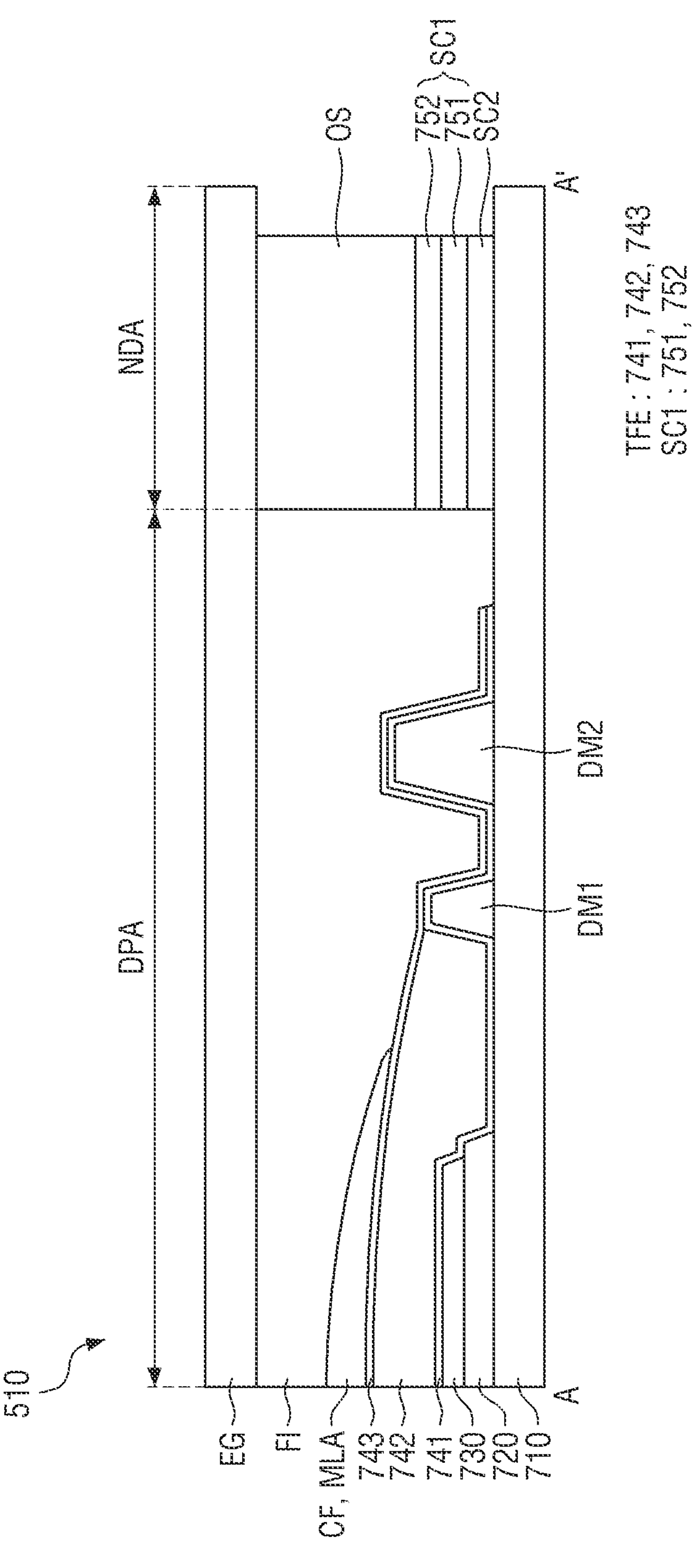
FIG. 11 is a cross-sectional view illustrating a portion of a display panel, which is taken along the line A-A' of FIG. 6 according to some embodiments.
Figure 12:
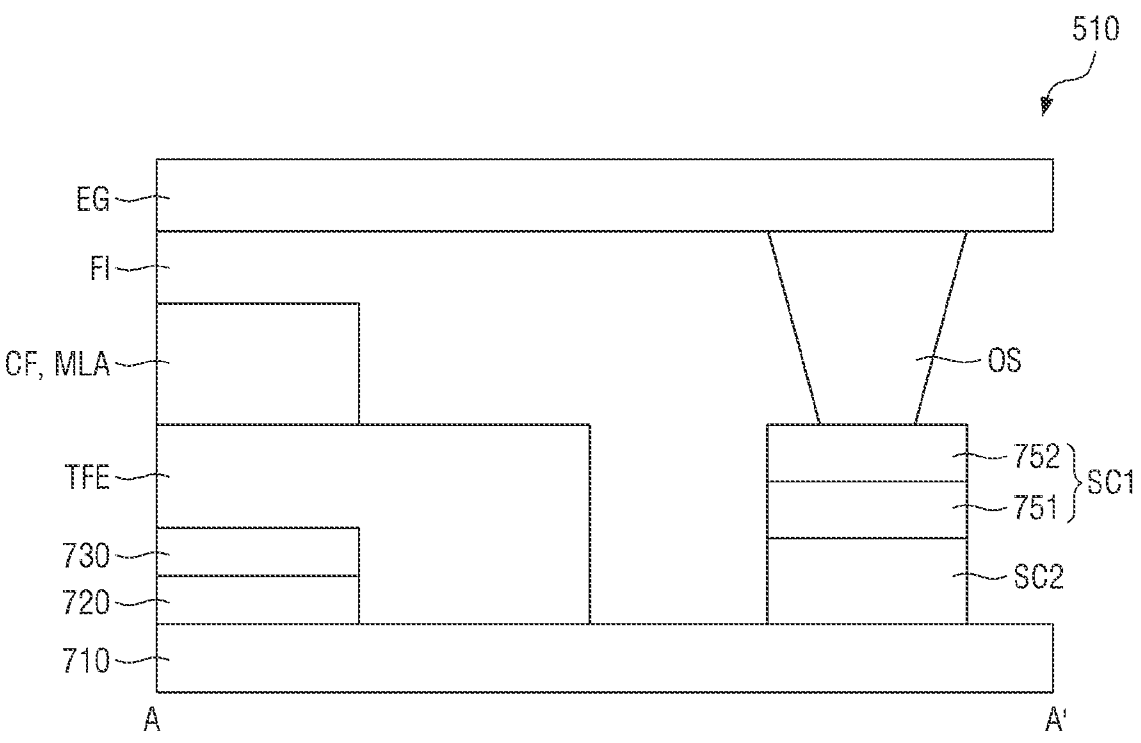
FIG. 12 is a cross-sectional view schematically illustrating a portion of a display panel, which is taken along the line A-A' of FIG. 6 according to some embodiments.

FIG. 11 is a cross-sectional view illustrating a portion of the display panel 510, which is taken along the line A-A' of FIG. 6. FIG. 12 is a cross-sectional view schematically illustrating a portion of the display panel 510, which is taken along the line A-A' of FIG. 6.

The embodiments of FIGS. 11 and 12 may be at least partially similar to those of FIGS. 7 and 8. Hereinafter, only the embodiments of FIGS. 11 and 12, which are different from those of FIGS. 7 and 8, will be described. Therefore, features that are not described in FIGS. 11 and 12 will be replaced with the description of the embodiments of FIGS. 7 and 8.

In the embodiments of FIGS. 11 and 12, unlike the embodiments illustrated with respect to FIGS. 7 and 8, the sealing member 600 of the display panel 510 includes an organic spacer OS and a first sealing compensation layer SC1, and further includes a second sealing compensation layer SC2. For example, the second sealing compensation layer SC2 is a layer located below the first sealing compensation layer SC1. For example, the second sealing compensation layer SC2 serves to further compensate for the height of the organic spacer OS.

The second sealing compensation layer SC2 may include a third compensation layer formed on the same layer as at least a portion of the electrodes of the transistor TR located below the OLED. For example, the transistor is a device formed on the semiconductor wafer substrate 710, and may include a gate electrode GE, a source electrode SE, and a drain electrode DE. The second sealing compensation layer SC2 may be manufactured by the same process using the same material as that of at least one of the gate electrode GE, the source electrode SE, or the drain electrode DE of the transistor TR. Therefore, the stacked structure of the sealing member 600 may be summarized as listed in Table 1.

TABLE 1

| Title | Features |
|---|---|
| Organic spacer OS | — |
| Second compensation layer of the first sealing compensation layer SC1 | Located below the organic spacer OS. Manufactured by the same process using the same material as that of the refractive film MLA. |
| First compensation layer of the first sealing compensation layer SC1 | Located below the second compensation layer. Manufactured by the same process using the same material as that of the color filter. |
| Third compensation layer of the second sealing compensation layer SC2 | Located below the first compensation layer. Manufactured by the same process using the same material as that of at least one of the gate electrode, the source electrode, or the drain electrode of the transistor. |

Meanwhile, the second sealing compensation layer SC2 may include a multi-metal layer. For example, the second sealing compensation layer SC2 may include a fourth compensation layer as well as the third compensation layer. The fourth compensation layer may be manufactured by the same process using the same material as that of at least one connection electrode CE (or capacitor electrode) located between the transistor TR transistor and the OLED 730. Therefore, a lower surface of the first compensation layer may be in direct contact with an upper surface of the fourth compensation layer. In this case, the stacked structure of the sealing member 600 may be summarized as listed in Table 2.

TABLE 2

| Title | Features |
|---|---|
| Organic spacer OS | — |
| Second compensation layer of the first sealing compensation layer SC1 | Located below the organic spacer OS. Manufactured by the same process using the same material as that of the refractive film MLA. |
| First compensation layer of the first sealing compensation layer SC1 | Located below the second compensation layer. Manufactured by the same process using the same material as that of the color filter. |
| Fourth compensation layer of the second sealing compensation layer SC2 | Located below the first compensation layer. Manufactured by the same process using the same material as that of at least one connection electrode. |
| Third compensation layer of the second sealing compensation layer SC2 | Located below the fourth compensation layer. Manufactured by the same process using the same material as that of at least one of the gate electrode, the source electrode, or the drain electrode of the transistor. |

Meanwhile, a plurality of metals included in the second sealing compensation layer SC2 described in Tables 1 and 2 may be floating electrodes that are not electrically connected to the plurality of metals located in the display area DPA of the display panel 510. For example, the plurality of metals included in the second sealing compensation layer SC2 have an island shape that is not electrically connected to the signal lines and the plurality of metals located in the display area DPA.

A method of manufacturing a display device according to some embodiments of the present disclosure will be described as follows.

The method of manufacturing the display device 10 according to some embodiments may include the steps of preparing a display panel 510 including a semiconductor wafer substrate 710 and an OLED 730 located on the semiconductor wafer substrate 710, preparing an encapsulation substrate EG on which an organic spacer OS is arranged to correspond to at least a portion of the non-display area NDA of the display panel 510, coating a filler FI on one surface of the encapsulation substrate EG to correspond to a display area DPA of the display panel 510, and bonding the encapsulation substrate EG coated with the filler FI to the display panel 510. In this case, the first sealing compensation layer SC1 that is directly in contact with the organic spacer OS may be arranged in the non-display area NDA of the display panel 510.

The first sealing compensation layer SC1 may be manufactured by the same process using the same material as that of the color filter CF and the refractive film MLA, which are arranged in the display area DPA of the display panel 510.

Meanwhile, the second sealing compensation layer SC2 may be located below the first sealing compensation layer SC1. For example, the second sealing compensation layer SC2 is a layer located below the first sealing compensation layer SC1, and serves to further compensate for the height of the organic spacer OS.

The second sealing compensation layer SC2 may include at least one of a third compensation layer or a fourth compensation layer. The third compensation layer may be manufactured by the same process using the same material as that of at least a portion of the electrodes of the transistor TR located below the OLED 730. The fourth compensation layer may be manufactured by the same process using the same material as that of at least one connection electrode CE (or capacitor electrode) located between the transistor TR and the OLED 730.

The electronic or electric devices and/or any other relevant devices or components according to embodiments of the present invention described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Although aspects of some embodiments of the present disclosure have been described with reference to the accompanying drawings, it will be apparent to those skilled in the art that embodiments according to the present disclosure can be embodied in other specific forms without departing from the technical spirits and essential characteristics. Thus, the above-described embodiments are to be considered in all respects as illustrative and not restrictive.

In concluding the detailed description, those skilled in the art will appreciate that many variations and modifications can be made to the disclosed embodiments without substantially departing from the spirit and scope of embodiments according to the present invention. Therefore, the disclosed embodiments of the invention are used in a generic and descriptive sense only and not for purposes of limitation.

What is claimed is:

1. A display device comprising:

a display panel including a semiconductor wafer substrate and an OLED on the semiconductor wafer substrate;

an encapsulation substrate on the display panel;

a sealing member between the display panel and the encapsulation substrate to couple the display panel with the encapsulation substrate; and a filler surrounded by the sealing member between the display panel and the encapsulation substrate, wherein the sealing member includes:

an organic spacer corresponding to at least a portion of a non-display area of the display panel; and a first sealing compensation layer below the organic spacer, wherein a lower surface of the organic spacer directly contacts the first sealing compensation layer.

2. The display device of claim 1, wherein the display panel includes:

an encapsulation layer on the OLED;
a color filter on the encapsulation layer; and
a refractive film on the color filter.

3. The display device of claim 2, wherein the first sealing compensation layer includes:
a first compensation layer on a same layer as the color filter; and
a second compensation layer on the first compensation layer and on a same layer as the refractive film.

4. The display device of claim 3, wherein the lower surface of the organic spacer directly contacts an upper surface of the second compensation layer.

5. The display device of claim 3, further comprising a second sealing compensation layer below the first sealing compensation layer.

6. The display device of claim 5, wherein the second sealing compensation layer includes at least a third compensation layer on a same layer as at least a portion of a plurality of electrodes included in a transistor below the OLED.

7. The display device of claim 6, wherein the plurality of electrodes included in the transistor include a gate electrode, a source electrode and a drain electrode, and
the third compensation layer is on a same layer as at least one of the gate electrode, the source electrode, or the drain electrode.

8. The display device of claim 6, wherein the second sealing compensation layer further includes at least a fourth compensation layer between the third compensation layer and the second compensation layer and on a same layer as a connection electrode electrically connecting the transistor with the OLED.

9. The display device of claim 8, wherein a lower surface of the first compensation layer directly contacts an upper surface of the fourth compensation layer.

10. The display device of claim 8, wherein a plurality of metals in the second sealing compensation layer are floating electrodes that are not electrically connected to a plurality of metals in a display area of the display panel.

11. A method of manufacturing a display device, the method comprising:
preparing a display panel including a semiconductor wafer substrate and an OLED on the semiconductor wafer substrate;
preparing an encapsulation substrate on which an organic spacer corresponds to at least a portion of a non-display area of the display panel;
coating a filler on one surface of the encapsulation substrate to correspond to a display area of the display panel; and
bonding the encapsulation substrate coated with the filler to the display panel,
wherein a first sealing compensation layer directly contacts the organic spacer in a non-display area of the display panel.

12. The method of claim 11, wherein the display panel includes
an encapsulation layer on the OLED;
a color filter on the encapsulation layer; and
a refractive film on the color filter.

13. The method of claim 12, wherein preparing the display panel includes, as part of forming the first sealing compensation layer,
forming a first compensation layer on a same layer as the color filter; and
forming a second compensation layer on the first compensation layer and forming the second compensation layer on a same layer as the refractive film.

14. The method of claim 13, wherein a lower surface of the organic spacer directly contacts an upper surface of the second compensation layer.

15. The method of claim 13, wherein the display panel further includes a second sealing compensation layer below the first sealing compensation layer.

16. The method of claim 15, wherein the second sealing compensation layer includes at least a third compensation layer formed on the same layer as at least a portion of a plurality of electrodes included in a transistor below the OLED.

17. The method of claim 16, wherein the plurality of electrodes in the transistor include a gate electrode, a source electrode, and a drain electrode, and
preparing the display panel includes forming a third compensation layer on a same layer as at least one of the gate electrode, the source electrode, or the drain electrode as part of forming the second sealing compensation layer.

18. The method of claim 16, wherein the forming the second sealing compensation layer further includes forming at least a fourth compensation layer between the third compensation layer and the second compensation layer on the same layer as a connection electrode electrically connecting the transistor with the OLED.

19. The method of claim 18, wherein a lower surface of the first compensation layer directly contacts an upper surface of the fourth compensation layer.

20. The method of claim 18, wherein a plurality of metals included in the second sealing compensation layer are floating electrodes that are not electrically connected to a plurality of metals in a display area of the display panel.

* * * * *